United States Patent
Downey et al.

(10) Patent No.: US 6,559,062 B1
(45) Date of Patent: May 6, 2003

(54) METHOD FOR AVOIDING NOTCHING IN A SEMICONDUCTOR INTERCONNECT DURING A METAL ETCHING STEP

(75) Inventors: Stephen Ward Downey, Orlando, FL (US); Allen Yen, Orlando, FL (US); Thomas Michael Wolf, Orlando, FL (US); Paul B. Murphey, Winter Garden, FL (US)

(73) Assignee: Agere Systems, Inc., Allentown, PA (US)

( * ) Notice: Subject to any disclaimer, the term of this patent is extended or adjusted under 35 U.S.C. 154(b) by 41 days.

(21) Appl. No.: 09/713,504

(22) Filed: Nov. 15, 2000

(51) Int. Cl.⁷ ............................................. H01L 21/461
(52) U.S. Cl. ...................................... 438/734; 438/754
(58) Field of Search ................................ 438/723, 725, 438/734, 740, 15, 16, 743, 749, 754

(56) References Cited

U.S. PATENT DOCUMENTS

| | | | |
|---|---|---|---|
| 5,314,575 A | 5/1994 | Yanagida | |
| 5,582,679 A | 12/1996 | Lianjun et al. | |
| 5,583,078 A | 12/1996 | Osenbach | |
| 5,612,254 A | 3/1997 | Mu et al. | |
| 5,620,909 A | 4/1997 | Lin et al. | |
| 5,739,579 A | 4/1998 | Chiang et al. | |
| 5,849,639 A | 12/1998 | Molloy et al. | |
| 5,851,302 A | * 12/1998 | Solis | 134/1.2 |
| 5,851,849 A | 12/1998 | Comizzoli et al. | |
| 5,858,879 A | * 1/1999 | Chao et al. | 134/1.2 |
| 5,861,103 A | 1/1999 | Yamazaki et al. | |
| 5,940,736 A | 8/1999 | Brady et al. | |
| 5,968,847 A | 10/1999 | Ye et al. | |
| 5,972,179 A | 10/1999 | Chittipeddi et al. | |
| 6,001,741 A | 12/1999 | Alers | |
| 6,040,214 A | 3/2000 | Boyd et al. | |
| 6,057,230 A | 5/2000 | Liu | |
| 6,071,808 A | 6/2000 | Merchant et al. | |

* cited by examiner

Primary Examiner—Olik Chaudhuri
Assistant Examiner—Thanh Pham
(74) Attorney, Agent, or Firm—David G. Maire; Reusse Brownlee Bowdoin & Wolter, P.A.

(57) ABSTRACT

A process (100) for forming a metal interconnect (102) in a semiconductor device (82) using a photoresist layer (20) having a thickness (T) of no more than 0.66 microns without forming a notch in the side (30) of the interconnect. A reactive ion etching process (118) used to remove portions of a metal layer (16) to form the interconnect includes a burst etch step (108) wherein a first high flow rate (48) of passivation gas is delivered, followed by a main metal etch step (110) wherein the flow rate of passivation gas is reduced to a second lower value.

11 Claims, 5 Drawing Sheets

FIG. 2
(PRIOR ART)

| STEPS | Cl$_2$ | BCl$_3$ | CHF$_3$ | PRESS | Ps | Pb | He | TIME |
|---|---|---|---|---|---|---|---|---|
| ARC | 80 | – | 6 | 8 | 1200 | 30 | 10 | 30 |
| BT | 15 | 70 | – | 8 | 800 | 150 | 10 | 15 |
| ME | 60 | 30 | 3 | 10 | 1000 | 100 | 10 | EP |
| BARRIER | 50 | 30 | 1 | 10 | 1000 | 100 | 10 | 18 |
| OE1 | 30 | 30 | 3 | 10 | 1000 | 100 | 10 | 16 |
| OE2 | 30 | 30 | 7 | 10 | 1000 | 100 | 10 | 20 |

FIG. 5

| | STEPS | Cl$_2$ | BCl$_3$ | CHF$_3$ | PRESS | Ps | Pb | He | TIME |
|---|---|---|---|---|---|---|---|---|---|
| 104 | ARC | 80 | – | 6 | 8 | 1200 | 30 | 10 | 30 |
| 106 | BT | 15 | 70 | – | 8 | 800 | 150 | 10 | 15 |
| 108 | BURST | 60 | 30 | 10 | 10 | 1000 | 100 | 10 | 5 |
| 110 | ME | 60 | 30 | 3 | 10 | 1000 | 100 | 10 | EP |
| 112 | BARRIER | 50 | 30 | 1 | 10 | 1000 | 100 | 10 | 18 |
| 114 | OE1 | 30 | 30 | 3 | 10 | 1000 | 100 | 10 | 16 |
| 116 | OE2 | 30 | 30 | 7 | 10 | 1000 | 100 | 10 | 20 |

METHOD FOR AVOIDING NOTCHING IN A SEMICONDUCTOR INTERCONNECT DURING A METAL ETCHING STEP

FIELD OF THE INVENTION

This invention relates generally to the field of microelectronics, and more specifically to a method for forming a sub-micron sized interconnect on a semiconductor wafer, and specifically to an improved etching procedure for avoiding the formation of a notch in a metal layer masked with a photoresist layer having a thickness of no more than 0.66 microns.

BACKGROUND OF THE INVENTION

There is a continuing demand in the semiconductor industry for lower cost and improved reliability. The ability to create semiconductor devices with sub-micron sized features has greatly reduced the cost and improved the reliability of current devices when compared to similar devices produced just years ago. Smaller features result in a decrease in performance degrading capacitances and resistances and allow more devices to be formed on a single semiconductor wafer. However, the continued reduction in the size of the interconnections between the various active devices on a semiconductor wafer (interconnects) can result in an adverse electrical effect. Although the resistance of metal interconnects is reduced by a decrease in the length of the metal run, a reduction in the width and/or thickness of the interconnect structure will result in a corresponding increase in resistance per unit length, as well as an increased risk of electomigration failures due to the higher current density carried by the narrower, thinner metal line. Thus, the designer of a very large scale integration (VLSI) device must carefully balance the advantages and disadvantages of continued reduction of the interconnect dimensions.

Continued reduction of dimensions in semiconductor devices have been made possible, in part, by advances in lithography, such as the use of more advanced cameras and the development of more sensitive photoresist materials. However, the accuracy of the lithographic pattern must then be reproduced onto the semiconductor. The use of reactive ion etching (RIE) has allowed the industry to transfer very small images in photoresist to an underlying metal layer. RIE removes material by exposing a surface to a combination of chemical etchants and a stream of plasma ions. In order to control the slope of the resulting metal layer side surface, it is desirable to have as thin a layer of photoresist as possible, limited however, by the relative removal rates of the masking photoresist and the exposed metal layer.

FIG. 1 illustrates a prior art semiconductor device 10 at a selected stage of a manufacturing process. Device 10 includes a semiconductor wafer such as silicon (Si) wafer 12 having an active device region such as silicon dioxide ($SiO_2$) layer 14 formed therein. A metal layer such as aluminum copper (AlCu) layer 16 is disposed over the silicon dioxide layer 14, and is shown in FIG. 1 has having been partially removed by etching to form an interconnect structure 18. The width of interconnect 18 is defined by the width W of a photoresist layer 20 disposed over the metal layer 16. The aluminum copper layer 16 is separated from the silicon dioxide layer 14 by a titanium (Ti) layer 22 disposed on the silicon dioxide layer 14 and a first titanium nitride (TiN) layer 24 disposed on the titanium layer 22. In order to eliminate problems associated with back reflection of light during the photo-lithography process, it is known to form an anti-reflective coating (ARC) layer between the photoresist layer 20 and the metal layer 16. A second titanium nitride layer 26 and a layer of silicon oxy-nitride (SiON) 28 interact to function as an anti-reflective coating layer 27.

The materials and dimensions of device 10 and the processes used to manufacture such a structure are known in the art. For example, the aluminum copper material of metal layer 16 may range from about 0–1% copper, and may be deposited by known processes such as physical vapor deposition (PVD) to a thickness from 5,000–7,000 Angstroms. The titanium and titanium nitride barrier layers 22,24,26 may be deposited by PVD or chemical vapor deposition (CVD) to a thickness of 300–500 Angstroms. The ARC layer 28 may be deposited by CVD or plasma enhanced CVD to a thickness of 300–350 Angstroms. Portions of the barrier layers 28,26,24,22 and metal layer 16 are removed by an RIE process to form the interconnect 18 corresponding to the pattern formed in the photoresist layer 20.

A prior art recipe 40 for an RIE process for forming interconnect 18 is illustrated in FIG. 2. The recipe 40 includes the various steps shown in column 42 in the order taken, along with the respective flow rates of etchant gasses $Cl_2$, $BCl_3$, and passivation gas $CHF_3$ shown in scc/min in the respective columns 44,46,48. The gas pressure present in the reactor during the respective step is shown in millitorr units in column 50. The source power and bias power applied during the respective steps are shown in watts in columns 52,54 respectively. The pressure of helium cooling gas supplied to the reverse side of the wafer 12 is shown as a constant 10 torr in column 56. Finally, the duration of each respective step is shown in seconds in column 58.

As shown in FIG. 2, the prior art RIE process begins with an etch step 60 10 lasting thirty seconds for removing the ARC layer 27. The $Cl_2$ gas acts as the etchant as the layers of material 28,26 are removed by high energy ions. The flow of $CHF_3$ acts as a passivation gas during this step. Passivation is a concept known in the art for depositing a buffer layer on the surfaces of a material being exposed to a reactive ion etch. As the horizontal surface of the material is removed by the combination of chemical and sputtering effects generated by the vertically oriented ions produced in the RIE process, the newly exposed side vertical surface is protected from the ion stream by the overlying masking layer. However, the newly exposed vertical surfaces continue to be exposed to the effects of the chemical etchants. This isotropic chemical effect results in the undesirable removal of material in the horizontal direction during the desirable removal of material in the vertical direction. Passivation gasses supply a layer of protective material to the newly exposed vertical surfaces to retard the isotropic effect, thereby limiting the removal of material in the horizontal direction. A common passivation gas is $CHF_3$ which is generally understood to provide a source of carbon that is deposited on the vertical surfaces of the metal layer being etched and which serves as a buffer against the continued corrosion of material in the horizontal direction. Without such passivation, an etched metal line may form as a trapezoid rather than the desired rectangular cross-sectional shape.

The ARC layer etch step 60 is followed by a fifteen second break through etch step 62, during which the flow of passivation gas is stopped. It is known in the art that the uppermost portion of a metal layer such as layer 16 will be more resistive to an etching process than will be the remainder of the layer. It is believed that a small amount of corrosion products may accumulate on the top surface of a metal layer during the processing of the device, thereby creating a thin interface layer 29, perhaps less than 100 Angstroms thick, that becomes more resistive to etching. Break through etch step 62 utilizes a significantly higher flow rate of $BCl_3$ than the other etch steps. In addition, the bias power level 54 is also significantly increased to provide a higher energy level to the etching ions. Moreover, the flow of passivation gas is preferably stopped in order to improve the removal rate, to improve the control of the resulting geometry, and for chamber cleanliness considerations.

A main metal etch step 64 is then performed for a duration EP, which may be approximately 60 seconds for example, to remove the remaining thickness of the metal layer 16. Strategies for determining the appropriate time to end this step are well known in the art. Barrier etch step 66 and over-etch steps 68,70 are then conducted to remove the TiN and Ti layers 24,22 and to remove a small portion of the $SiO_2$ layer.

As the densities of semiconductor devices continue to increase, the corresponding sizes of semiconductor structures continue to decrease. Designers of such devices prefer to decrease the thickness T of the photoresist layer 20 in order to facilitate the production of such small structures. However, if the thickness T is reduced to significantly less than one micron, subsequent control of photoresist erosion will result in the formation of a notch 32 in the interconnect 18, as is shown in FIG. 1. One skilled in the art may appreciate that the presence of notch 32 may be deleterious to the quality of device 10 by locally increasing the resistance of interconnect 18, thereby affecting the electromagnetic environment of the device and by increasing the heat generation in the interconnect 18 proximate the notch 32. It is also known that by maintaining the thickness T of photoresist layer 20 to be close to or greater than about one micron, the presence of notch 32 can be prevented by using recipe parameters that consume additional photoresist and thereby provide additional buffering material to the reactor environment. For example, maintaining the bias power at a higher level during the metal etch step 64 would reduce the notching effect however it would also increase the amount of photoresist removed during the main etch step. Accordingly, the designers of prior art devices 10 are forced to maintain the thickness T of photoresist layer 20 to a value greater than would otherwise be preferred in order to control the geometry of interconnect 18. Most prior art devices 10 are manufactured with a thickness T of photoresist layer 20 to be approximately one micron, and rarely with a thickness T of photoresist layer to be as low as 0.75 microns.

BRIEF SUMMARY OF THE INVENTION

Accordingly, there is a particular need for a method of forming an interconnect without notching during the transition from a barrier layer etch step to a metal layer etch step. There is a further need to develop a process for metal layer etching that will yield a required slope in the sides of the etched layer without notching when the masking photoresist layer has a thickness of less than 0.75–1.00 micron.

Accordingly, a method for making a semiconductor device of the type having a metal layer disposed on a semiconductor layer is disclosed herein, the method comprising the steps of: exposing the metal layer to a reactive ion etch comprising a flow of etchant gas and a flow of passivation gas; and controlling the ratio of the flow rate of passivation gas to the flow rate of etchant gas to a first value during an initial period of the reactive ion etch and to a second value during a remainder of the reactive ion etch. The first value may be at least twice or at least thrice the second value.

A further method is disclosed herein for making a semiconductor device of the type having a metal layer disposed on a semiconductor layer, the metal layer having a top interface layer, the method comprising the steps of: exposing the metal layer to a reactive ion etch comprising a flow of etchant gas containing no passivation gas to remove the top interface layer; exposing the metal layer to a reactive ion etch comprising a flow of etchant gas containing a first concentration of passivation gas to remove a first portion of the metal layer; and exposing the metal layer to a reactive ion etch comprising a flow of etchant gas containing a second concentration of passivation gas to remove a second portion of the metal layer. The first concentration may be at least twice or at least thrice the second concentration. A further method is disclosed herein for making a semiconductor device of the type having a metal layer disposed on a semiconductor layer and protected by a patterned resist layer, the method comprising the steps of: exposing the metal layer to a reactive ion etch (RIE) to form a metal interconnect on the semiconductor layer by selectively removing portions of the metal layer not protected by the resist layer, the RIE further comprising: a burst etch step wherein a flow of passivation gas is provided at a first concentration with a flow of etchant gas; and a main etch step wherein a flow of passivation gas is provided at a second concentration with a flow of etchant gas. The first concentration may be at least twice or at least thrice the second concentration. The method may further comprises a break through step wherein a flow of etchant gas is provided without passivation gas to remove an interface layer portion of the metal layer prior to the burst etch step.

A product is disclosed herein formed by the process of: providing a semiconductor layer; forming a metal layer on the semiconductor layer; forming an anti-reflective coating layer on the metal layer; forming a patterned photoresist layer on the anti-reflective coating layer; conducting a reactive ion etch (RIE) process to form an interconnect on the semiconductor layer by removing portions of the ARC layer and metal layer exposed by the patterned photoresist layer, the RIE process further comprising: conducting an ARC etch step to remove portions of the anti-reflective coating layer; and conducting a metal etch step comprising a burst etch step followed by a main etch step, the burst etch step comprising providing a first concentration of passivation gas and the main etch step comprising providing a second concentration of passivation gas.

BRIEF DESCRIPTION OF THE DRAWINGS

The features and advantages of the present invention will become apparent from the following detailed description of the invention when read with the accompanying drawings in which:

FIG. 2 illustrates a prior art reactive ion etching recipe used to form the interconnect in the device of FIG. 1.

FIG. 5 illustrates a recipe for the reactive ion etching steps of FIG. 3.

Similar structures illustrated in more than one figure are numbered consistently among the various figures.

DETAILED DESCRIPTION OF THE INVENTION

Figure 3:
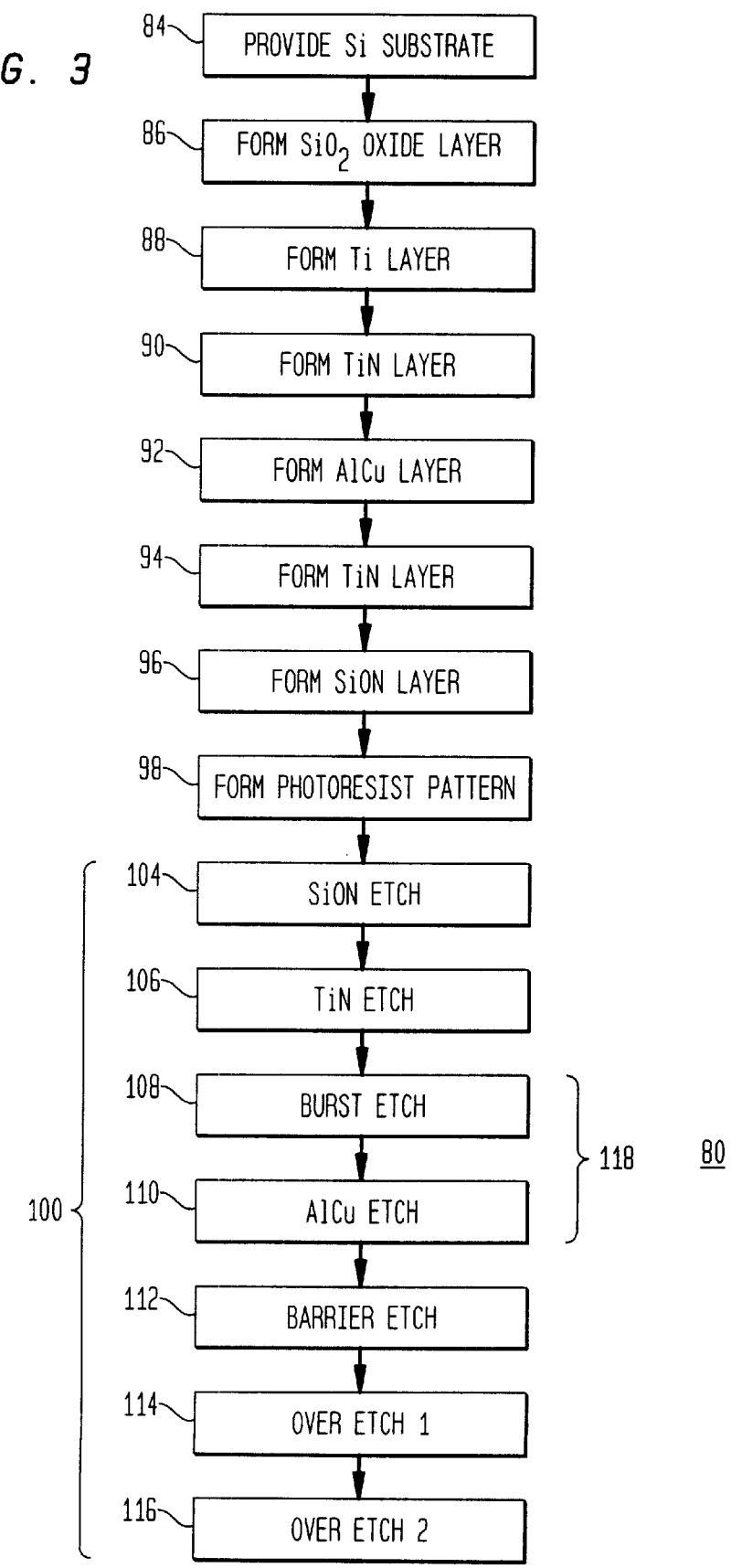
FIG. 3 illustrates a process for forming an interconnect on a semiconductor wafer.
Figure 4:
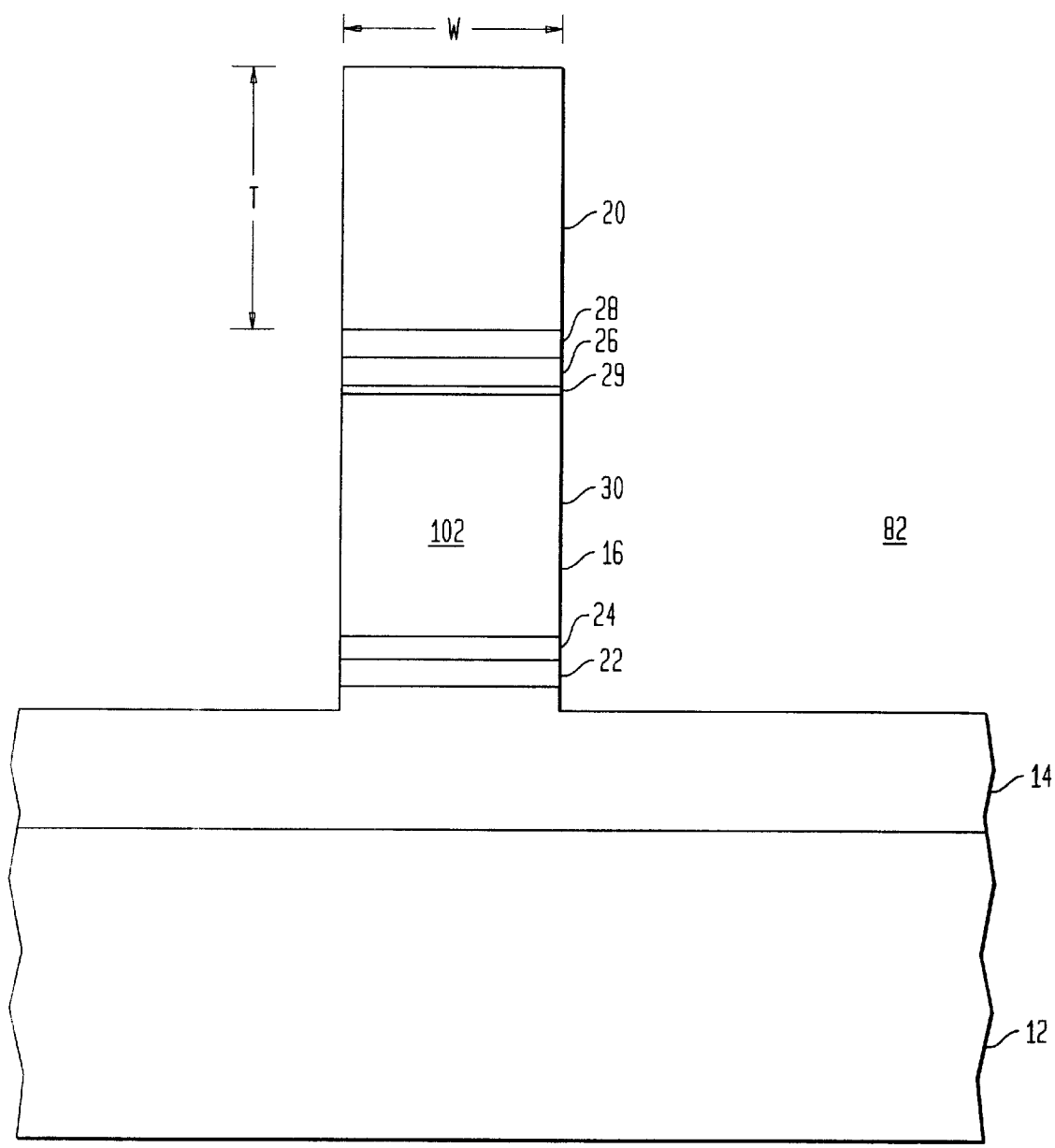
FIG. 4 illustrates a semiconductor device formed by the process of FIG. 3.

FIG. 3 illustrates the steps of a process 80 for forming a metal interconnect on a semiconductor substrate, and FIG. 4 illustrates a partial side section view of the semiconductor device 82 formed by the process 80 of FIG. 3.

A semiconductor substrate, such as silicon wafer 12, is provided in step 84. A layer of silicon dioxide 14 of approximately 1 micron is formed in a top portion of the wafer 12 at step 86, and barrier layers 22,24 of titanium and titanium nitride respectively are formed to a thickness of about 300 Angstroms each (0.03 microns) over the silicon dioxide layer 14 by processes known in the art at steps 88,90 respectively. A metal layer, such as aluminum copper layer 16, is then formed to a thickness of about 4,000–8,000 Angstroms over the titanium nitride layer 24 at step 92. Similarly, barrier layer 26 of about 250–1,000 Angstroms of titanium nitride, ARC layer 28 of about 250–700 Anstroms of silicon oxy-nitride, and a patterned photoresist layer 20 are formed over the aluminum copper layer 16 at steps 94,96,98 respectively. Each of layers 14, 22, 24 16, 26, 28 and 20 are typically formed over the entire surface of semiconductor wafer 12, with a pattern subsequently being formed in photoresist layer 20 by developing and removing selected areas of the photoresist corresponding to areas that will subsequently be exposed to a reactive ion etching process. At this stage of the process, layers 14, 22, 24, 16, 26 and 28 may extend over the entire surface of wafer 12. The layer of photoresist 20 preferably has a thickness T of no more than 0.66 micron, thereby facilitating the control of subsequent etching steps in order to obtain a desired interconnect geometry. The line width W is approximately 0.25 micron, with a pitch of about 0.48 micron.

A process 100 of reactive ion etching is then performed to form interconnect 102 having a desired slope to its side surfaces 30. The etching process 100 may includes steps 104,106,108,110,112,114,116 as illustrated in FIG. 3. One specific embodiment of etching process 100 is illustrated in the recipe 101 of FIG. 5, which is shown in the same format and with the same units of measurement as is FIG. 2.

A thirty second ARC etch step 104 is conducted with a flow 48 of $CHF_3$ passivation gas of 6 scc/min to remove the exposed portions of ARC layer 27. The passivation gas flow is then terminated during break through etch step 106 for the removal of interface layer 29. The main metal etch step 10 utilizes a passivation gas flow of 3 scc/min. However, the inventors have found that by increasing the flow of passivation gas during the etching of the top portion of metal layer 16, i.e. that portion susceptible to the formation of a notch 32, a side wall 30 may be formed on interconnect 102 without any notching. Thus, the process of FIG. 3 includes a metal etching step 118 having a first burst etch step 108 of five seconds wherein the flow of passivation gas has an initial high value, and a main metal etch step 110 wherein the flow of passivation gas has a second lower value. For the recipe of FIG. 5, the flow of $CHF_3$ passivation gas is 10 scc/min for the initial burst etch step 108, then is reduced to 3 scc/min for the main etch step 110. The availability of the extra passivation gas during burst etch step 108 makes available a plentiful supply of carbon, CF and CH radicals for the rapid formation of a layer of buffering material on the surface of the newly exposed vertical walls. This provides protection for the metal layer 16 against excess removal of material in the horizontal plane of the wafer surface 12 as the etch process progresses vertically toward the wafer 12, thereby preventing the undercutting of barrier layer 26 and eliminating any potential notching. The flow of passivation gas 48 is then reduced and main etch step 110 is continued for a time period EP necessary to remove the remaining depth of aluminum copper layer 16 exposed by the burst etch step 108. The release of carbon from the photoresist layer 20 as a result of the etching provides a source of polymers for providing additional passivation protection during main etch 110. By providing a relatively higher ratio of passivation gas during burst step 108, the process of FIGS. 3 and 5 makes available an adequate amount of passivation material to prevent notching during the removal of a top portion of layer 16. Maintaining a high flow of passivation gas beyond this initial burst period 108 would result in an undesirable slope in sides 30 of the interconnect since an excess of passivating polymers become available from the removal of carbon from photoresist layer 20.

Once the metal layer 16 is removed, the process of FIG. 3 further includes steps 112, 114, 116 for the removal of the barrier layers 24,22 and a small portion of the top of silicon dioxide layer 14.

A process in accordance with this invention is useful for etching a metal having an interface layer 29, or for etching any combination of adjacent material layers wherein a first layer can be removed at a different rate than a second layer during an RIE process. This process recognizes and exploits the differing reactivity of the two materials to the ion stream plus chemical etchants and to the chemical etchants alone. The invention provides a burst of extra passivation material during a portion of an etch step to provide a relatively rapid accumulation of buffering material on the side walls of the material being etched, in combination with a reduction in the delivery of the passivation material during the removal of the remainder of the material being etched. The ratio of the flow rate of passivation gas to the flow rate of etchants during a burst portion of an etch step may be at least twice or at least thrice that during the remaining portion of the etch step. In the embodiment illustrated in FIG. 5, the burst etch step 108 includes the delivery of passivation gas at a multiple of 10/3 above that provided during step 110. One skilled in the art may appreciate that the particular ratio or percentage of passivation gas provided during the burst step may vary depending upon the particular requirements of the materials and geometries involved. The embodiment illustrated in FIG. 5 prevents a notch from being formed at a top (first etched) portion of a metal line, however, one skilled in the art may appreciate that in other embodiments a burst etch step may be used to prevent a notch from being formed at a bottom (last etched) portion of a material.

Figure 1:
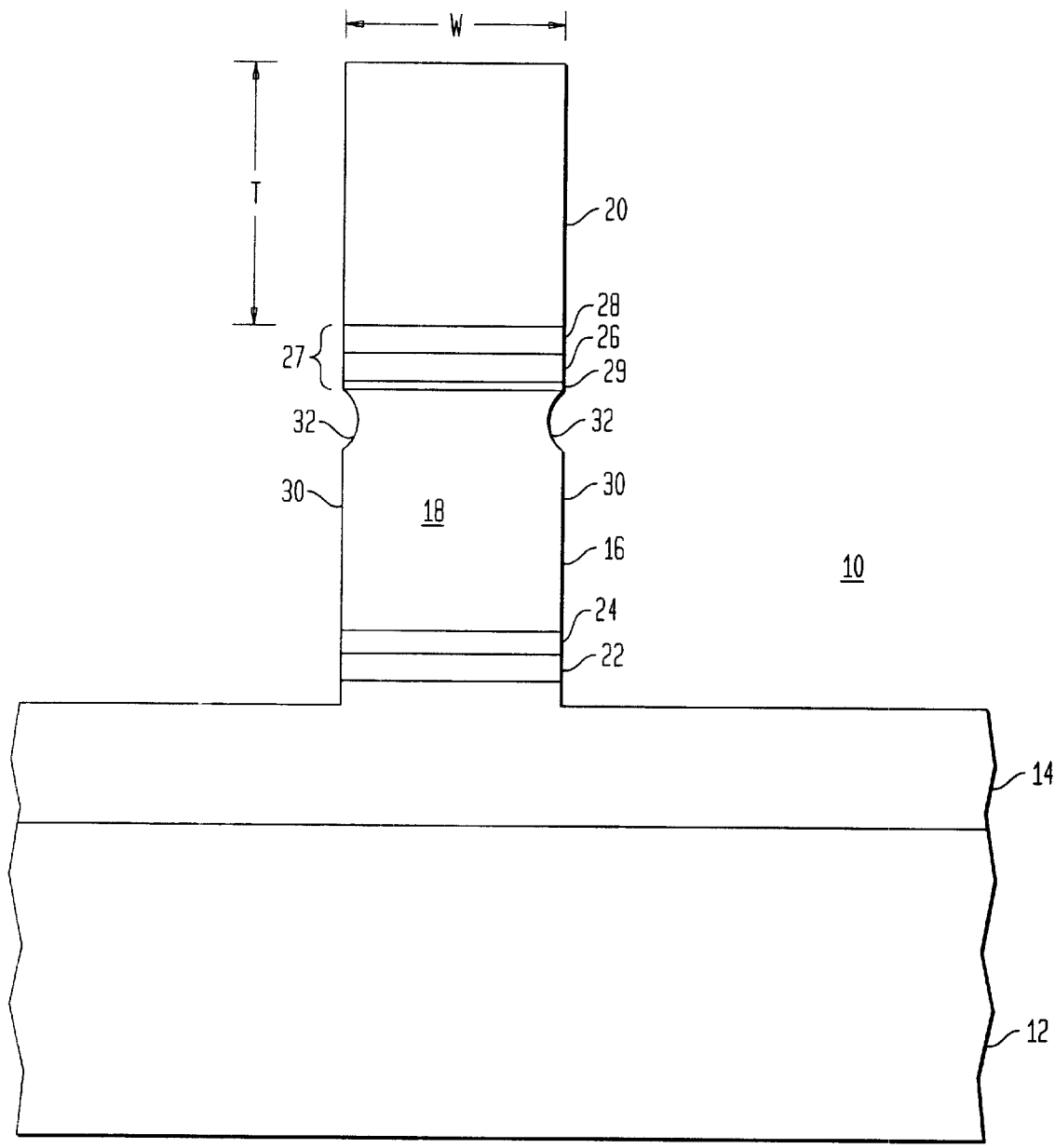
FIG. 1 illustrates a side sectional view of a prior art semiconductor device having a notched interconnect.

The device 82 of FIG. 4 formed by the process of FIG. 3, including the specific recipe of FIG. 5, includes a desired slope on the sides 30 of aluminum copper interconnect 102, without any undesirable notching or undercutting of barrier layer 26, in spite of the fact that the thickness T of photoresist layer 20 is no more than 0.66 microns. By permitting such a thin photoresist layer 20 to be used, the process of this invention allows the designer of a semiconductor device to take full benefit of available improvements in lithography techniques. An essentially vertical slope may be obtained in the sides 30 of a metal interconnect without the notching as is found on prior art devices having such a thin photoresist layer, as illustrated in FIG. 1.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method for making a semiconductor device of the type having a metal layer disposed on a semiconductor layer, the metal layer having a top interface layer, the method comprising the steps of:

exposing the metal layer to a reactive ion etch comprising a flow of etchant gas containing no passivation gas to remove the top interface layer;

exposing the metal layer to a reactive ion etch comprising a flow of etchant gas containing a first concentration of passivation gas to remove a first portion of said metal layer; and exposing the metal layer to a reactive ion etch comprising a flow of etchant gas containing a second concentration of passivation gas to remove a second portion of said metal layer.

2. The method of claim 1, wherein the first concentration is at least twice the second concentration.

3. The method of claim 1, wherein the first concentration is at least thrice the second concentration.

4. The method of claim 1, wherein the first concentration is a multiple of 10/3 the second concentration.

5. The method of claim 1, wherein the first concentration is greater than the second concentration.

6. A method for making a semiconductor device of the type having a metal layer disposed on a semiconductor layer and protected by a patterned resist layer, the method comprising the steps of:

exposing the metal layer to a reactive ion etch (RIE) to form a metal interconnect on the semiconductor layer by selectively removing portions of the metal layer not protected by the resist layer, the RIE further comprising:

a burst etch step wherein a flow of passivation gas is provided at a first concentration with a flow of etchant gas to remove a first portion of said metal layer; and a main etch step wherein a flow of passivation gas is provided at a second concentration with a flow of etchant gas to remove a second portion of said metal layer.

7. The method of claim 6, wherein the first concentration is at least twice the second concentration.

8. The method of claim 6, wherein the first concentration is at least thrice the second concentration.

9. The method of claim 6, wherein the first concentration is a multiple of 10/3 the second concentration.

10. The method of claim 6, wherein the first concentration is greater than the second concentration.

11. The method of claim 6, wherein the RIE further comprises a break through step wherein a flow of etchant gas is provided without passivation gas to remove an interface layer portion of the metal layer prior to the burst etch step.

* * * * *